(12) United States Patent
Effertz et al.

(10) Patent No.: US 10,557,877 B2
(45) Date of Patent: *Feb. 11, 2020

(54) ALARM PANE ASSEMBLY

(71) Applicant: SAINT-GOBAIN GLASS FRANCE, Courbevoie (FR)

(72) Inventors: Christian Effertz, Aachen (DE); Guillaume Francois, Aachen (DE); Stefan Droste, Herzogenrath (DE); Klaus Schmalbuch, Aachen (DE); Ariane Weissler, Aachen (DE); Hans-Werner Kuster, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/302,064

(22) PCT Filed: Jul. 26, 2017

(86) PCT No.: PCT/EP2017/068843
§ 371 (c)(1),
(2) Date: Nov. 15, 2018

(87) PCT Pub. No.: WO2018/024564
PCT Pub. Date: Feb. 8, 2018

(65) Prior Publication Data
US 2019/0146019 A1  May 16, 2019

(30) Foreign Application Priority Data
Aug. 2, 2016 (EP) .................... 16182361

(51) Int. Cl.
*G01R 27/26* (2006.01)
*G08B 21/18* (2006.01)
*G08B 13/04* (2006.01)

(52) U.S. Cl.
CPC ............. *G01R 27/26* (2013.01); *G08B 13/04* (2013.01); *G08B 21/182* (2013.01)

(58) Field of Classification Search
CPC ...... G01R 27/26; G08B 13/04; G08B 21/182; B32B 17/10036
See application file for complete search history.

(56) References Cited

U.S. PATENT DOCUMENTS

| 4,092,636 A | 5/1978 | Shepherd, Jr. |
| 4,684,929 A | 8/1987 | Edwards et al. |

(Continued)

FOREIGN PATENT DOCUMENTS

| CN | 203224957 U | 10/2013 |
| CN | 203232520 U | 10/2013 |

(Continued)

OTHER PUBLICATIONS

International Search Report for International Application No. PCT/EP2016/078214 filed Nov. 19, 2016 on behalf of Saint-Gobain Glass France, dated Mar. 14, 2017. 7 pages. (English translation + German original).

(Continued)

*Primary Examiner* — Quan-Zhen Wang
*Assistant Examiner* — Rajsheed O Black-Childress
(74) *Attorney, Agent, or Firm* — Steinfl + Bruno LLP

(57) ABSTRACT

An alarm pane assembly is presented. The alarm pane assembly includes a pane made of tempered glass, a transparent, electrically conductive coating that is arranged on a surface of the pane, a sensor unit, and an antenna. According to one aspect, the sensor unit includes a transmitting unit and an evaluation unit. During operation, the transmitting unit forwards a high-frequency voltage signal with a frequency f in a range of 0.1 GHz to 6 GHz to the antenna, the antenna emits electromagnetic radiation of the frequency f, and the (Continued)

Figure 1A:
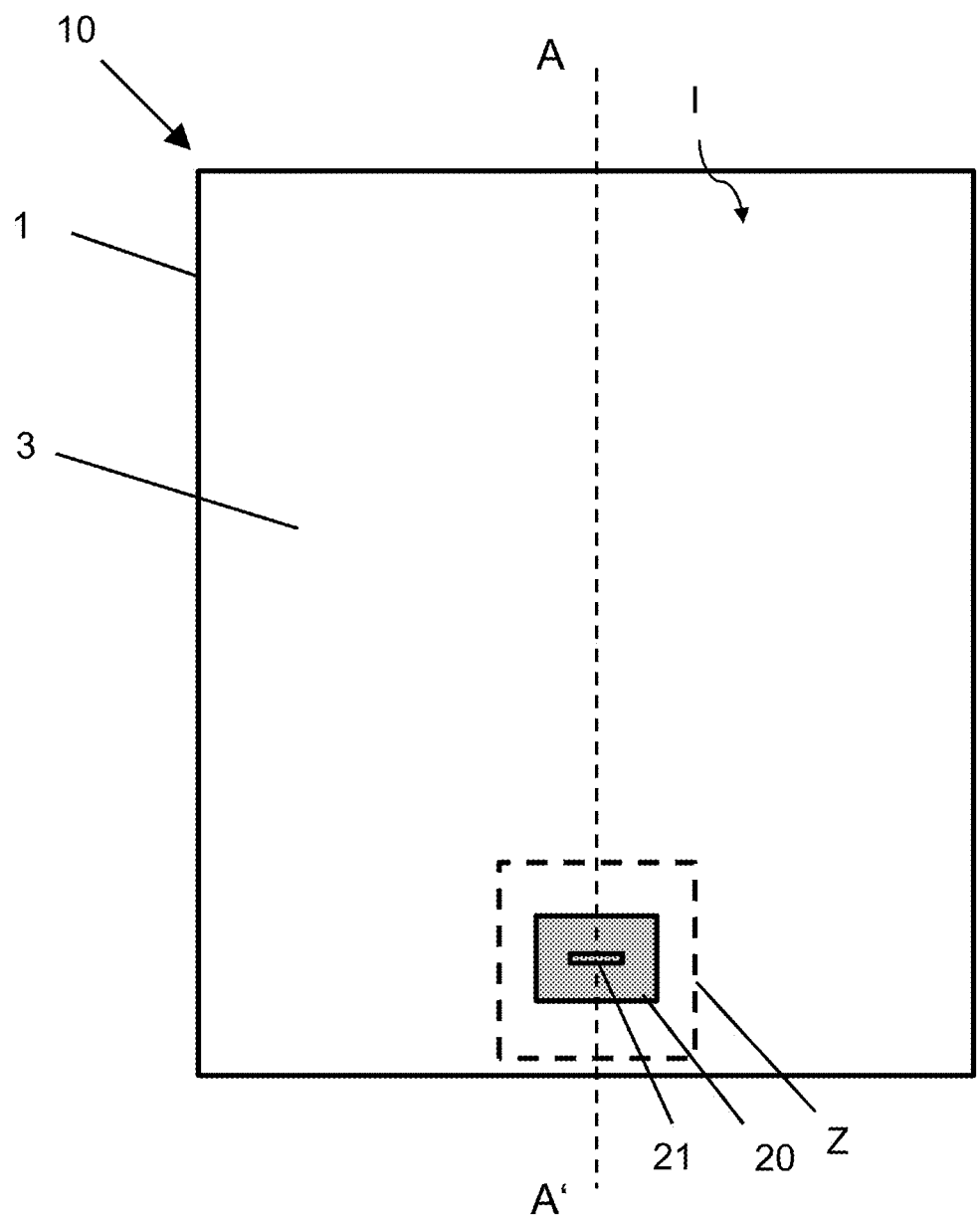

evaluation unit measures the impedance matching of the transmitting unit to the antenna. According to another aspect, the antenna is electromagnetically coupled to the conductive coating, and the sensor unit outputs an alarm signal when the measured impedance matching deviates from a reference value.

22 Claims, 7 Drawing Sheets

(56) References Cited

U.S. PATENT DOCUMENTS

| | | | |
|---|---|---|---|
| 5,007,199 | A | 4/1991 | Dunagan et al. |
| 5,917,410 | A | 6/1999 | Cecic et al. |
| 6,068,914 | A | 5/2000 | Boire et al. |
| 7,722,948 | B2 * | 5/2010 | Dixon ............... B32B 15/08 428/339 |
| 8,400,301 | B1 | 3/2013 | Kersch et al. |
| 10,242,542 | B2 | 3/2019 | Droste et al. |
| 10,490,036 | B2 | 11/2019 | Effertz et al. |
| 2002/0045037 | A1 | 4/2002 | Boire et al. |
| 2002/0124422 | A1 | 9/2002 | Hamann |
| 2004/0135572 | A1 | 7/2004 | Nakazaki et al. |
| 2007/0276550 | A1 | 11/2007 | Desai et al. |
| 2009/0033123 | A1 | 2/2009 | Torr et al. |
| 2009/0134024 | A1 | 5/2009 | Neel et al. |
| 2010/0000181 | A1 | 1/2010 | Duncan et al. |
| 2010/0090597 | A1 | 4/2010 | Werners et al. |
| 2011/0139756 | A1 | 6/2011 | Raible et al. |
| 2012/0080421 | A1 | 4/2012 | Macher et al. |
| 2012/0250834 | A1 | 10/2012 | Smith et al. |
| 2014/0139240 | A1 | 5/2014 | Burger |
| 2015/0343884 | A1 | 12/2015 | Rousselet et al. |
| 2016/0140836 | A1 | 5/2016 | Stamer |
| 2016/0282978 | A1 | 9/2016 | Wang |
| 2018/0040213 | A1 | 2/2018 | Schaeffer |
| 2018/0197388 | A1 | 7/2018 | Droste et al. |
| 2018/0350208 | A1 | 12/2018 | Droste et al. |
| 2019/0287358 | A1 | 9/2019 | Effertz et al. |

FOREIGN PATENT DOCUMENTS

| | | |
|---|---|---|
| DE | 4300350 A1 | 7/1994 |
| DE | 4327664 C1 | 11/1994 |
| DE | 19754295 A1 | 6/1999 |
| DE | 19913766 A1 | 4/2000 |
| DE | 19860872 A1 | 7/2000 |
| EP | 0058348 A2 | 8/1982 |
| EP | 0847965 B2 | 6/1998 |
| EP | 0847965 B1 | 10/2004 |
| EP | 2139049 A1 | 12/2009 |
| EP | 2200097 A1 | 6/2010 |
| GB | 2181586 A | 4/1987 |
| JP | 2003085660 A | 3/2003 |
| JP | 2003141649 A | 5/2003 |
| JP | 2005018131 A | 1/2005 |
| JP | 2005043217 A | 2/2005 |
| JP | 2005326251 A | 11/2005 |
| JP | 2006251909 A | 9/2006 |
| JP | 2007272411 A | 10/2007 |
| JP | 2008046081 A | 2/2008 |
| JP | 2008102826 A | 5/2008 |
| JP | 2008308402 A | 12/2008 |
| JP | 2012083808 A | 4/2012 |
| JP | 2012114526 A | 6/2012 |
| JP | 2013089938 A | 5/2013 |
| JP | 2014520401 A | 8/2014 |
| KR | 20030090315 A | 11/2003 |
| RU | 2004106598 A | 7/2005 |
| WO | 01/22378 A1 | 3/2001 |
| WO | 03/014034 A1 | 2/2003 |
| WO | 2011/038003 A1 | 3/2011 |
| WO | 2012/031912 A1 | 3/2012 |
| WO | 2014/184107 A1 | 11/2014 |
| WO | 2017/085302 A1 | 5/2017 |
| WO | 2017/085303 A1 | 5/2017 |
| WO | 2018/024564 A1 | 2/2018 |
| WO | 2018/024565 A1 | 2/2018 |

OTHER PUBLICATIONS

International Search Report for International Application No. PCT/EP2016/078215 filed on Nov. 19, 2016 in the name of Saint-Gobain Glass France, dated Mar. 24, 2017, 7 pages (English Translation + German Original).
International Search Report for International Application No. PCT/EP2017/068843 filed Jul. 26, 2017 on behalf of Saint-Gobain Glass France, dated Oct. 26, 2017. 7 pages. (English Translation + German Original).
International Search Report for International Application No. PCT/EP2017/068844 filed Jul. 26, 2017 on behalf of Saint-Gobain Glass France, dated Oct. 26, 2017. 6 pages. (English Translation + German Original).
Korean Office Action for Korean Application No. 10-2018-7004591 filed Feb. 2, 2018 on behalf of Saint-Gobain Glass France, dated Oct. 24, 2018. 12 pages (English Translation Only).
Korean Office Action for Korean Application No. 10-2018-7004593 filed Feb. 14, 2018 on behalf of Saint-Gobain Glass France, dated Oct. 25, 2018. 12 pages (English Translation Only).
Notice of Allowance for U.S. Appl. No. 15/741,258, filed Dec. 30, 2017 on behalf of Saint-Gobain Glass France, dated Aug. 8, 2018. 15 pages.
Written Opinion International Application No. for PCT/EP2016/078215 filed Nov. 19, 2016 on behalf of Saint-Gobain Glass France, dated Mar. 24, 2017. 15 pages. (English translation + German original).
Written Opinion for International Application No. PCT/EP2016/078214 filed Nov. 19, 2016 on behalf of Saintgobain Glass France, dated Mar. 14, 2017. 14 pages. (English translation + German original).
International Preliminary Report on Patentability for International Application No. PCT/EP2016/078214 filed Nov. 19, 2016 on behalf of Saint-Gobain Glass France, dated May 22, 2018. 7 pages.
International Preliminary Report on Patentability for International Application No. PCT/EP2017/068844 filed on Jul. 26, 2017 on behalf of Saint-Gobain Glass France, dated Feb. 5, 2019. 5 pages.
Notice of Allowance for U.S. Appl. No. 15/741,258, filed Dec. 30, 2017, on behalf of Saint-Gobain Glass France, dated Dec. 17, 2018. 15 pages.
Notice of Allowance for U.S. Appl. No. 15/741,261, filed Dec. 30, 2017 on behalf of Saint Gobain Glass France, dated Apr. 30, 2019. 15 pages.
International Preliminary Report on Patentability for International Application No. PCT/EP2017/068843 filed on Jul. 26, 2017 on behalf of Saint-Gobain Glass France, dated Feb. 5, 2019. 5 pages.
International Preliminary Report on Patentability for International Application No. PCT/EP2016/078215 filed on Nov. 19, 2016 on behalf of Saint-Gobain Glass France.-Gobain Glass France, dated May 22, 2018. 8 pages.
Written Opinion for International Application No. PCT/EP2017/068844 filed Jul. 26, 2017 behalf of Saint-Gobain Glass France, dated Oct. 26, 2017. 9 pages. (German original + English translation).
Written Opinion for International Application No. PCT/EP2017/068843 filed Jul. 26, 2017 behalf of Saint-Gobain Glass France, dated Oct. 26, 2017. 9 pages. (German original + English translation).
Notice of Allowance for U.S. Appl. No. 16/302,014, filed Nov. 15, 2018 on behalf of Saint Gobain Glass France, dated Oct. 15, 2019. 11 Pages.
Non-Final Office Action for U.S. Appl. No. 15/741,261, filed Dec. 30, 2017 on behalf of Saint Gobain Glass France, dated Jul. 24, 2019. 21 Pages.

(56) References Cited

OTHER PUBLICATIONS

Non-Final Office Action for U.S. Appl. No. 16/302,014, filed Nov. 15, 2018 on behalf of Saint Gobain Glass France, dated Aug. 5, 2019. 20 Pages.
Notice of Allowance for U.S. Appl. No. 15/741,261, filed Dec. 30, 2017 on behalf of Saint Gobain Glass France, dated Sep. 16, 2019. 12 Pages.

* cited by examiner

ALARM PANE ASSEMBLY

CROSS REFERENCE TO RELATED APPLICATIONS

The present application is the U.S. national stage of International Patent Application PCT/EP2017/068843 filed internationally on Jul. 26, 2017, which, in turn, claims priority to European Patent Application No. 16182361.2 filed on Aug. 2, 2016.

The invention relates to an alarm pane assembly, in particular for an insulating glazing unit, with a transparent, electrically conductive coating and a sensor unit for measuring impedance matching. The invention further relates to a method for operating the alarm pane assembly.

To detect the breakage of a pane, for example, in the event of a break-in or other damage, so-called "alarm panes" are used. These alarm panes are usually a component of an insulating glazing unit or a multiple glazing unit. As a rule, at least one pane is made of tempered single-pane safety glass (SPSG). In the event of damage, the tempered pane breaks, over its entire area, into small fragments.

A conductor loop, whose resistance is measured by an evaluation electronic system, such as is known, for example, from EP 0 058 348 A2, is customarily arranged on alarm panes. When the alarm pane breaks, the conductor loop is also destroyed and a change in resistance is measured. The evaluation electronic system outputs an alarm signal in this case. Such conductor loops are not very attractive visually, are expensive to produce and difficult to contact.

Also known, for example, from DE 197 54 295 A1 or DE 198 60 872 A1, are alarm panes that have a transparent, electrically conductive coating. Here, as well, the detection of the breaking of a pane is done by the measurement of resistances such that, in the event of a change in resistance of the transparent, electrically conductive coating, an alarm signal is output.

The object of the present invention now consists in providing an improved alarm pane assembly that is simple and economical to produce and is less visible optically. In addition, the alarm pane assembly according to the invention is suitable to be produced in a retrofitting process with already existing panes.

The object of the present invention is accomplished according to the invention by an alarm pane assembly in accordance with the disclosure. Preferred embodiments also emerge from the disclosure.

The alarm pane assembly according to the invention comprises at least:
- at least one first pane, which consists of tempered glass and has an outer surface (I) and an inner surface (II),
- at least one transparent, electrically conductive coating, which is arranged on the inner surface (II) of the first pane, and
- a sensor unit having a transmitting unit, an antenna, and an evaluation unit, wherein the transmitting unit forwards a high-frequency voltage signal with a frequency f of 0.1 GHz to 6 GHz to the antenna and the antenna emits electromagnetic radiation of the frequency f and the evaluation unit measures the impedance matching of the transmitting unit to the antenna,
wherein the antenna is electromagnetically coupled to the transparent, electrically conductive coating, and the sensor unit outputs an alarm signal when the measured impedance matching deviates from a comparison value.

The invention is based on the knowledge that many panes, and, in particular, insulating glass panes already have transparent coatings with good electrical conductivity. These transparent, electrically conductive coatings have diverse purposes: for example, reflecting infrared radiation or low-E properties. The alarm pane assembly according to the invention includes a sensor unit that monitors the integrity of the pane with a sensor without contact and outputs an alarm signal in the event of breakage of the pane. Complex contacting of the transparent, electrically conductive coating is eliminated by the contact-free monitoring. Such contacts are customarily soldered and highly susceptible to aging since the contact resistance at the solder joint is altered by aging processes. This does not present a problem with the monitoring method presented here since the direct electrical contact of the transparent, electrically conductive coating is eliminated. Since an already present transparent, electrically conductive coating can be used, a separate production step, for example, for printing an electrical conductor loop, is eliminated. The transparent, electrically conductive coating is hardly visible optically and is, consequently, very aesthetic. It can, for example, also have antireflective properties and further improve visibility through the pane. All of this was unexpected and surprising for the inventors.

An alarm pane assembly according to the invention includes at least one first pane having an outer surface (I) and an inner surface (II). The first pane usually serves for separating an exterior space from an interior space, for example, of a building, of a display case, or of a vehicle. In this case, the outer surface (I) can face the outside, i.e., outward; and the inner surface (II), the inside, i.e., inward.

In the case of a use of the alarm pane assembly for protection of an interior space against theft or damage, the outer surface (I) would be the so-called "exposed side" from which intrusion usually occurs. In this case, the inner surface (II) with the inductive sensor and the sensor unit would be protected against tampering, since they would not be accessible until after breakage and removal of the first pane.

In the case of the alarm pane assembly for breakage monitoring, for example, in a vehicle such as a train or an aircraft, the inner surface (II) can also be exposed to potential attacks, for example, destruction with an emergency hammer in the event of danger. In this case, deliberate tampering with the sensor unit is not likely.

In an advantageous improvement of the alarm pane assembly according to the invention, the first pane has only electrically conductive elements or coatings that are transparent.

In another advantageous improvement of the alarm pane assembly according to the invention, the first pane has no electrically conductive elements other than the transparent, electrically conductive coating or another transparent, electrically conductive coating. Here, the feature "elements" includes all electrical conductors elements and, in particular, printed or glued-on metallic conductors such as wires or metal foils.

Of course, the outer surface (I) of the first pane can also have a further coating, for example, a further transparent, electrically conductive coating. In an advantageous embodiment of the alarm pane assembly according to the invention, the sensitivity of the sensor can be selected such that only the integrity of the transparent, electrically conductive coating on the inner surface (II) of the first pane is monitored, or, in addition, the integrity of the other transparent, electrically conductive coating on the outer surface (I) of the first pane is also monitored.

In an advantageous embodiment of an alarm pane assembly according to the invention, the transparent, electrically conductive coating is bonded to the first pane such that in the event of breakage of the first pane, the transparent, electrically conductive coating is damaged. For this, the transparent, electrically conductive coating is preferably deposited directly on the inner surface (II) of the first pane, particularly preferably as a thin-film stack. Particularly suitable methods for this are cathodic sputtering ((magnetron) sputtering), chemical vapor deposition (CVD), and/or thermal evaporation. This is particularly advantageous for enabling reliable detection of breakage of the first pane.

The detection of breakage of the first pane, or the associated damage to the transparent, electrically conductive coating, is done via a sensor unit with an antenna. The antenna emits electromagnetic radiation with a frequency f. For this, the sensor unit includes a transmitting unit, an antenna, and an evaluation unit, wherein the transmitting unit forwards a high-frequency voltage signal with a frequency f to the antenna, the antenna emits electromagnetic radiation of the frequency f, and the evaluation unit measures the impedance matching of the antenna to the transmitting unit.

The frequency f is one specific frequency, a plurality of specific frequencies, one frequency band or a plurality of frequency bands, or a combination thereof, wherein the frequency f is selected from the range of 0.1 GHz to 6 GHz, preferably from 0.4 GHz to 3 GHz, and in particular from 0.8 GHz to 3 GHz.

The invention is based on the principle that the antenna is coupled to the transparent, electrically conductive coating and is, in particular, electromagnetically coupled, and the sensor unit outputs an alarm signal when the measured impedance matching of the transmitting unit and of the antenna and, in particular, of the antenna with a transparent, electrically conductive coating electromagnetically coupled thereto deviates from a comparison value.

The measured impedance matching of the transmitting unit to the arrangement consisting of the antenna, the first pane, and the transparent, electrically conductive coating on the first pane can be determined with any suitable measurement method.

The impedance matching can advantageously be measured using the standing wave ratio (SWR) between the amplitude of the signal V sent to the antenna compared to that of the signal R reflected by the antenna. The standing wave ratio is defined by: $SWR=(V+R)/(V-R)$.

The amplitudes of the signal can, for example, be measured as voltage and indicate the voltage standing wave ratio (VSWR).

Without reflection (R=0), the standing wave ratio is 1; with total reflection (R=V), it is infinite. This means that, in the case of a high standing wave ratio, the signal sent to the antenna is reflected back and only a small signal is emitted from the antenna. In contrast, in the case of a standing wave ratio of 1, the full signal is emitted by the antenna. Suitable electronic circuits for measuring the standing wave ratio are well known to the person skilled in the art, for example, using an "LF-to-2.5 GHz Dual Logarithmic Detector/Controller for Power, Gain, and VSWR Measurements" (MAX2016) of the company Maxim Integrated.

In a high-frequency transmission system, as the antenna interacting with the transparent, electrically conductive coating is, the standing wave ratio is a measure of how well the high-frequency signal can be emitted by the antenna.

In an advantageous embodiment of the alarm pane assembly according to the invention, the sensor unit outputs an alarm signal when the measured voltage standing wave ratio deviates from the comparison value by more than 1.5:1, preferably more than 2:1.

Alternatively, the impedance matching can advantageously be measured using the S11 parameter of the system consisting of the transmitting unit and the antenna connected thereto. In a high-frequency transmission system, as the antenna interacting with the transparent, electrically conductive coating is, the S11 parameter is a measure of how well the high-frequency signal can be emitted by the antenna.

In an advantageous embodiment of an alarm pane assembly according to the invention, the sensor unit outputs an alarm signal when the measured S11 parameter deviates from the comparison value by more than one decibel (1 dB), preferably more than 1.5 dB.

As investigations of the inventors have demonstrated, the impedance matching of the transmitting unit to the assembly consisting of the antenna, the first pane, and the transparent, electrically conductive coating depends in a highly sensitive manner on the arrangement and the integrity of the transparent, electrically conductive coating. In the event of breakage of the first pane and associated damaging of the transparent, electrically conductive coating, a major disturbance of the impedance matching occurs. In other words, the impedance signal measured changes greatly. Impedance matching is thus a good and sensitive indicator for measuring the integrity of the first pane and of the entire alarm pane assembly and detecting intrusion or tampering attempts.

If the first pane is damaged in a region, the first pane breaks, as a result of the fact that it is tempered, into a large number of small fragments over the entire first pane. The associated damage to the transparent, electrically conductive coating can be detected with high accuracy and reliability by the alarm pane assembly. Even a substitution of the transparent, electrically conductive coating through the attaching of a metal foil or a metal plate, made, for example, of aluminum or copper, at the position of the electrically conductive coating can be distinguished with high accuracy and reliability from the intact, transparent, electrically conductive coating. The alarm pane assembly according to the invention is highly suitable for detection of damage, intrusion attempts, or other tampering attempts.

Of course, in an advantageous embodiment of the alarm pane assembly according to the invention, the antenna is galvanically isolated from the transparent, electrically conductive coating.

In an advantageous embodiment of the alarm pane assembly according to the invention, the distance a between the antenna and the transparent, electrically conductive coating is from 0.1 mm to 20 mm, preferably from 0.2 mm to 10 mm, and in particular from 0.5 mm to 5 mm.

All suitable antennas known to the person skilled in the art can be used as an antenna. Advantageous are, for example, simple line antennas, loop antennas, patch antennas, monopole antennas, and/or dipole antennas. Particularly suitable are line antennas as monopole antennas with a length b of 10 mm to 100 mm and a width of 0.5 mm to 5 mm, since these are visually unobtrusive and easy to integrate.

The first pane is made of tempered glass. In an advantageous embodiment of the first pane, it is tempered such that in the event of breakage of the first pane, the fragments are smaller than a detection region of the antenna. If the fragments are smaller, for example, because they have a smaller area than the detection region or a smaller maximum diameter than the detection region, it is guaranteed that at least one break line lies within the detection region of the sensor, enabling reliable detection of breakage of the first pane.

In an advantageous embodiment of an alarm pane assembly according to the invention, the antenna has a length b and the detection region of the antenna comprises at least one circle with a diameter d of more than 0.5*b, preferably of more than 1*b, particularly preferably of more than 3*b, and in particular from 0.5*b to 3*b, with the center of the circle MK defined by orthogonal projection of the center of the antenna MA onto the inner surface (II) of the first pane. In the case of nonlinear antennas, the length b is defined by the maximum measurement of the longest dimension.

In an advantageous embodiment of the alarm pane assembly according to the invention, the sensor unit is arranged on the inside of the first pane, i.e., on the side that is defined by the inner surface (II) of the first pane. This is particularly advantageous for protecting the sensor unit against damage and tampering attempts from the exposed side, i.e., from the side of the first pane that is defined by the outer surface (I).

The sensor unit according to the invention can include other electronic components in addition to the antenna and the evaluation unit. Advantageously, the sensor unit includes a comparator, which compares the signal of the evaluation unit with a comparison value or threshold value and outputs an alarm signal in the event of a relevant deviation from the reference value. The alarm signal can be supplied via a power amplifier to further signal processing.

In an advantageous embodiment of the alarm pane assembly according to the invention, the sensor unit has an alarm transmitting unit, preferably a radio alarm transmitting unit with a radio signal whose frequency is in the range from 100 kHz to 100 GHz. The radio alarm transmitting unit is particularly preferably a Bluetooth transmitter or a WLAN transmitter. Alternatively, the alarm transmitting unit can also be an infrared transmitter. The alarm transmitting unit serves for communication with a receiver and, in particular, for transmitting an alarm signal when the sensor unit detects breakage of the pane. The integration of an alarm transmitting unit has the particular advantage that the sensor unit requires no external leads for forwarding the alarm signal, and thus a very simple, economical, and location-independent installation is enabled. Moreover, a possibility of tampering with the sensor unit is eliminated, by which means security is increased. This is particularly advantageous for the use or retrofitting of the sensor unit in an insulating glazing unit, which is customarily sealed to the outside. Of course, other data can also be transmitted via the alarm transmitting unit, such as functional status of the sensor unit, battery or accumulator charge status, or other parameters that are provided by other sensors, such as temperature or pressure.

In another advantageous embodiment of the alarm pane assembly according to the invention, the receiver communicating with the alarm transmitting unit will be arranged on the same side of the first pane as the alarm transmitting unit and the antenna, namely, on the inner side of the first pane. This is particularly advantageous, in the case of use of the alarm pane assembly for the protection of an interior against theft or damage, since the sensor unit, alarm transmitting unit, and receiver are protected against damage and tampering and would only be accessible after breakage of the first pane. In the case of the alarm pane assembly for monitoring breakage, for example, in a vehicle such as a train or an aircraft, the receiver can be arranged on either side of the first pane, so long as the first pane with the transparent, electrically conductive coating or its vicinity is adequately permeable to the signal of the transmitter.

In an advantageous embodiment of the alarm pane assembly according to the invention, the sensor unit includes an energy supply, preferably a battery, an accumulator, a supercapacitor, a thermoelectric generator, and/or a solar cell. The sensor unit advantageously includes no leads to an external power supply, but is energy self-sufficient. Alternatively, the energy supply can also be done or supplemented by continuous or discontinuous charging via, for example, an inductive charging device. This has the special advantage that the sensor unit requires no external leads, and thus a very simple, economical, and location-independent installation is enabled. Moreover, a possibility of tampering with the sensor unit is eliminated, which increases security. This is particularly advantageous for the use or the retrofitting of the sensor unit in an insulating glazing unit, which is customarily sealed to the outside.

The alarm pane assembly according to the invention can be used as a single-pane or as part of a multipane glazing, for example, part of an insulating glazing, double insulating glazing, triple insulating glazing, fire-resistant glazing, or safety glazing with composite panes.

In an advantageous embodiment of the alarm pane assembly according to the invention, the first pane is bonded to at least one other pane via at least one spacer, preferably a circumferential spacer completely surrounding the edge of the pane. The spacer is situated between the first pane and the other pane and is preferably fixed by adhesive bonding between the spacer and the panes. The spacer preferably comprises at least one hollow main body with at least two parallel pane contact walls, one outer wall with a gastight insulating layer, and a glazing interior wall.

As a main body, all hollow body profiles known according to the prior art can be used, regardless of their material composition. Mentioned here by way of example are polymeric or metallic main bodies.

Polymeric main bodies preferably contain polyethylene (PE), polycarbonates (PC), polypropylene (PP), polystyrene, polybutadiene, polynitriles, polyesters, polyurethanes, polymethyl methacrylates, polyacrylates, polyamides, polyethylene terephthalate (PET), polybutylene terephthalate (PBT), particularly preferably acrylonitrile butadiene styrene (ABS), acrylonitrile styrene acrylester (ASA), acrylonitrile butadiene styrene-polycarbonate (ABS/PC), styrene acrylonitrile (SAN), PET/PC, PBT/PC, and/or copolymers or mixtures thereof. Polymeric main bodies can optionally also contain other components, such as, for example, glass fibers. The polymeric materials used are, as a rule, gas-permeable such that if this permeability is undesirable, further measures must be taken.

Metallic main bodies are preferably made of aluminum or stainless steel and preferably have no gas permeability.

In an advantageous embodiment, the walls of the main body are gas-permeable. Regions of the main body in which such permeability is undesirable can, for example, be sealed with a gastight insulating layer. In particular, polymeric main bodies are used in combination with such a gastight insulating layer.

The main body preferably has a hollow chamber that contains a desiccant, preferably silica gel, $CaCl_2$, $Na_2SO_4$, activated carbon, silicates, bentonites, zeolites, and/or mixtures thereof, particularly preferably molecular sieves. Thus, absorption of atmospheric moisture by the desiccant is permitted and hence fogging of the panes and, in particular, of the inductive sensor is prevented.

The outer intermediate space between the first pane, another pane, and the spacer is preferably sealed relative to the space outside the pane by at least one sealing compound. The sealing compound preferably contains organic polysulfides, silicones, RTV (room temperature vulcanizing) silicone rubber, HTV (high temperature vulcanizing) silicone rubber, peroxide vulcanizing silicone rubber, and/or addition vulcanizing silicone rubber, polyurethanes, butyl rubber, and/or polyacrylates. In an optional embodiment, additions to increase aging resistance, for example, UV stabilizers can also be included.

In an advantageous embodiment of the alarm pane assembly according to the invention, the first pane is bonded via a spacer to a second pane and forms an insulating glass pane with double glazing.

In a particularly advantageous embodiment, the first pane is bonded via its inner surface (II) to the second pane.

In another particularly advantageous embodiment, the sensor unit is arranged in an intermediate space between the first pane and the second pane. This has the particular advantage that the sensor and the sensor unit are protected against outside influences such as moisture and dust, but are also particularly well protected against tampering and damage.

In an assembly that includes a first pane and a second pane, the antenna is advantageously not arranged precisely in the center between the panes, but nearer the to-be-monitored first pane, which has the transparent, electrically conductive coating. Of course, in this assembly, both panes can also have a transparent, electrically conductive coating, which can be monitored by a common antenna or by two antennas.

The first pane or the second pane can be bonded to another third pane via another spacer and thus form an insulating glazing pane with triple glazing.

In an advantageous embodiment of the alarm pane assembly according to the invention, the first pane is made of flat glass, float glass, soda lime glass, quartz glass, or borosilicate glass.

The first pane is tempered, preferably in accordance with DIN 12150-1: Glass in Building—Thermally Toughened Soda Lime Single-Pane Safety Glass—Part 1: Definition and Description, particularly preferably with a surface compressive stress greater than 100 N/mm$^2$ and in particular from 100 N/mm$^2$ to 150 N/mm$^2$. Due to the tempering, the first pane shatters when damaged, preferably into blunt-edged fragments having sizes of less than 1 cm$^2$.

The second, third, or further pane preferably contains glass, particularly preferably flat glass, float glass, quartz glass, borosilicate glass, soda lime glass, or clear plastics, preferably rigid clear plastics, in particular polyethylene, polypropylene, polycarbonate, polymethyl methacrylate, polystyrene, polyamide, polyester, polyvinylchloride, and/or mixtures thereof. Suitable glasses are known, for example, from EP 0 847 965 B1.

The thickness of the first, second, third, or further pane can vary widely and thus be ideally adapted to the requirements of the individual case. Preferably, panes with the standard thicknesses from 1.0 mm to 50 mm and preferably from 3 mm to 16 mm are used. The size of the pane can vary widely and is governed by the size of the use according to the invention.

In an advantageous embodiment of the invention, the first pane has dielectric properties and a relative permittivity number of 6 to 8 and in particular of approx. 7.

The panes can have any three-dimensional shape. Preferably, the three-dimensional shape has no shadow zones such that it can, for example, be coated by cathodic sputtering. Preferably, the panes are planar or slightly or greatly curved in one or a plurality of spatial directions. The panes can be colorless or colored.

In a preferred embodiment of the alarm pane assembly according to the invention, the first pane is areally bonded via its outer surface (I) and at least one intermediate layer, preferably a thermoplastic intermediate layer, to a second pane to form a composite pane. The second pane can, in turn, be areally bonded via another intermediate layer to a further third pane. The second and/or the third pane preferably contains a plastic. Such composite panes are particularly breach-resistant against penetration from outside such that high safety classes can be obtained. The panes of the composite pane are bonded to one another by at least one intermediate layer. The intermediate layer preferably contains a thermoplastic plastic, such as polyvinyl butyral (PVB), ethylene vinyl acetate (EVA), polyurethane (PU), polyethylene terephthalate (PET), or a plurality of layers thereof, preferably with thicknesses from 0.3 mm to 0.9 mm.

In an advantageous embodiment of the alarm pane assembly according to the invention, the transparent, electrically conductive coating is arranged on at least 70%, preferably 80% to 100%, and particularly preferably 98% to 100% of the through-vision area of the first pane. The through-vision area is the area of the first pane where vision is not prevented by the frame, spacers, or other attachment parts.

In an alternative advantageous embodiment of the alarm pane assembly according to the invention, the transparent, electrically conductive coating is arranged on at least 50%, preferably at least 70%, particularly preferably from 80% to 100%, and in particular 95% to 99% of the area of the inner surface of the first pane. In particular, a narrow circumferential edge region of the first pane can be coating free in order to avoid corrosion of the transparent, electrically conductive coating penetrating from the edge.

In an advantageous improvement of the alarm pane assembly according to the invention, the transparent, electrically conductive coating is full surface and has no recesses or coating-free regions.

The transparent, electrically conductive coating according to the invention is transparent to electromagnetic radiation, preferably electromagnetic radiation of a wavelength from 300 to 1300 nm, in particular to visible light from 390 nm to 780 nm. The term "transparent" means that the total transmittance of the pane, in particular for visible light, is preferably >70% and in particular >75% transparent. For specific applications, a lower transmittance can also be desirable, for which "transparent" can also mean 10% to 70% light transmittance. Such applications are, for example, glazings for the protection of objects that should not be exposed to major light irradiation, for example, paintings or textiles.

The transparent, electrically conductive coating is preferably a functional coating, particularly preferably a functional coating with solar protection action. A coating with solar protection action has reflection properties in the infrared range and thus in the range of solar irradiation. Thus, a heating up of the interior of a vehicle or building as a result of sunlight is reduced. Such coatings are known to the person skilled in the art and typically contain at least one metal, in particular silver or a silver-containing alloy. The transparent, electrically conductive coating can include a sequence of multiple individual layers, in particular at least one metallic layer and dielectric layers that contain, for example, at least one metal oxide. The metal oxide preferably includes zinc oxide, tin oxide, indium oxide, titanium oxide, silicon oxide, aluminum oxide, or the like, as well as combinations of one or a plurality thereof. The dielectric material can also contain silicon nitride, silicon carbide, or aluminum nitride.

This layer structure is generally obtained by a sequence of deposition operations that are carried out by a vacuum method such as magnetic field enhanced cathodic sputtering. Very fine metal layers, which contain, in particular, titanium or niobium, can also be provided on both sides of the silver layer. The lower metal layer serves as an adhesion and crystallization layer. The upper metal layer serves as a protective and getter layer to prevent modification of the silver during the further process steps.

Particularly suitable transparent, electrically conductive coatings contain at least one metal, preferably silver, nickel, chromium, niobium, tin, titanium, copper, palladium, zinc, gold, cadmium, aluminum, silicon, tungsten, or alloys thereof, and/or at least one metal oxide layer, preferably tin-doped indium oxide (ITO), aluminum-doped zinc oxide (AZO), fluorine-doped tin oxide (FTO, $SnO_2$:F), antimony-doped tin oxide (ATO, $SnO_2$:Sb), and/or carbon nanotubes and/or optically transparent, electrically conductive polymers, preferably poly(3,4-ethylene dioxythiophenes), polystyrene sulfonate, poly(4,4-dioctyl-cylopentadithiophene), 2,3-dichloro-5,6-dicyano-1,4-benzoquinone, mixtures, and/or copolymers thereof.

The thickness of the transparent, electrically conductive coating can vary widely and be adapted to the requirements of the individual case. It is essential here that the thickness of the transparent, electrically conductive coating not be so great that it becomes nontransparent to electromagnetic radiation, preferably electromagnetic radiation of a wavelength from 300 nm to 1300 nm and in particular visible light from 390 nm to 780 nm. The transparent, electrically conductive coating preferably has a layer thickness of 10 nm to 5 µm and particularly preferably of 30 nm to 1 µm.

The sheet resistance of the transparent, electrically conductive coating is preferably from 0.35 ohm/square to 200 ohm/square, preferably 0.5 ohm/square to 200 ohm/square, most particularly preferably from 0.6 ohm/square to 30 ohm/square, and in particular from 2 ohm/square to 20 ohm/square. The transparent, electrically conductive coating can, in principle, have even lower sheet resistances than 0.35 ohm/square, in particular if, in the case of their use, only a low light transmittance is required. Such sheet resistances are particularly suitable for detecting damage to the electrically conductive coating in the event of breakage of the first pane. The transparent, electrically conductive coating preferably has good infrared reflection properties and/or particularly low emissivities (low-E).

Another aspect of the invention includes a method for operating an alarm pane assembly according to the invention, wherein the measurement of the measurement signal is done continuously or periodically, preferably with a period length of 0.2 s to 100 s and is output as an output signal by the sensor unit. The output of the output signal can be done continuously or periodically, preferably with a period length of 0.2 s to 100 s.

Another aspect of the invention includes a use of an alarm pane assembly according to the invention as glazing of a display case, a showcase, preferably for the protection of valuable goods such as paintings, textiles, jewelry, for example, in a museum or at a jewelers, or as architectural glazing, insulating glazing, double insulating glazing, triple insulating glazing, fire-resistant glazing, safety glazing, or as glazing in a vehicle on land, on water, or in the air, such as a motor vehicle, a bus, a train, or an aircraft.

Another aspect of the invention includes a use of a sensor unit according to the invention with an antenna for retrofitting a glazing with a first pane made of tempered glass and a transparent, electrically conductive coating on the inner surface (II) to form an alarm pane assembly.

Figure 1B:
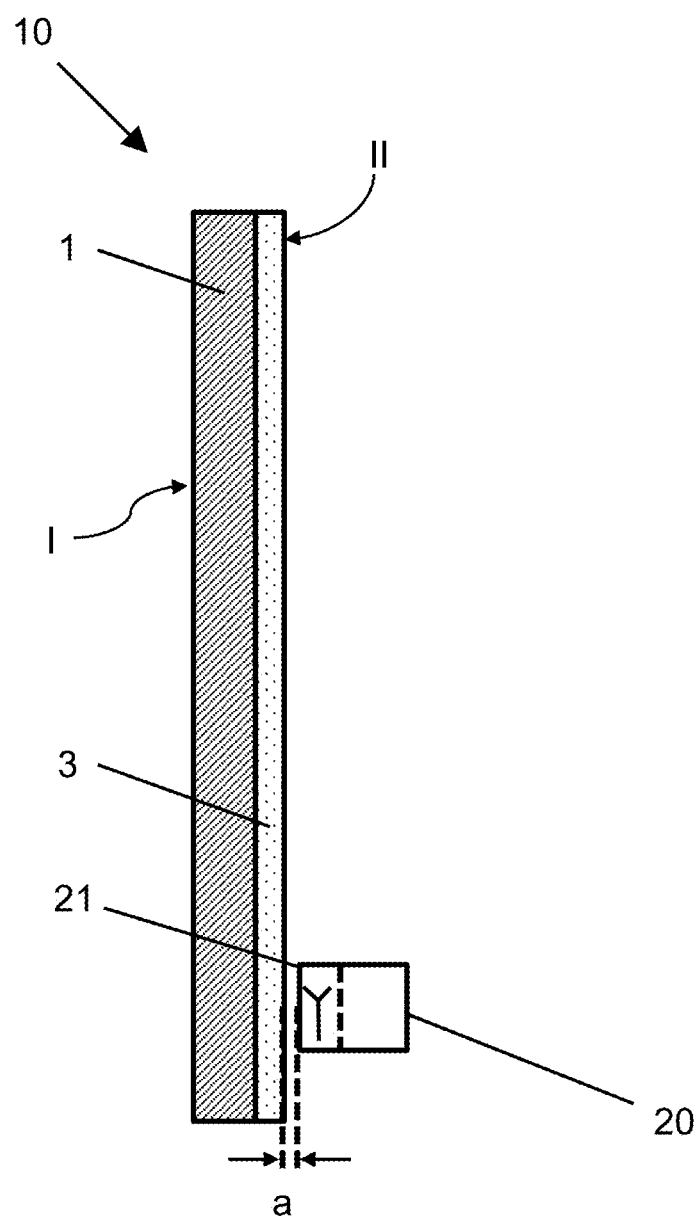
Figure 2:
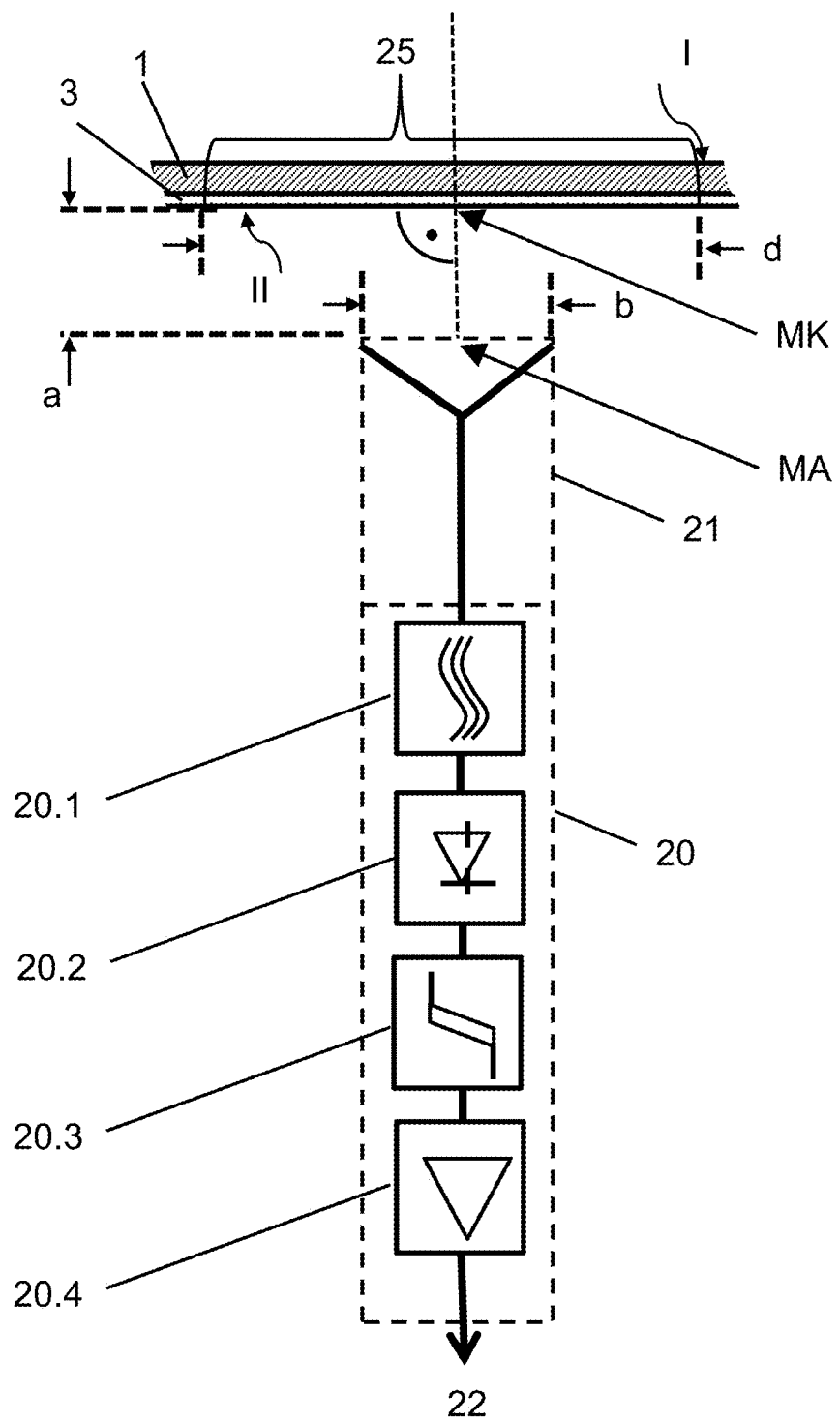
Figure 3A:
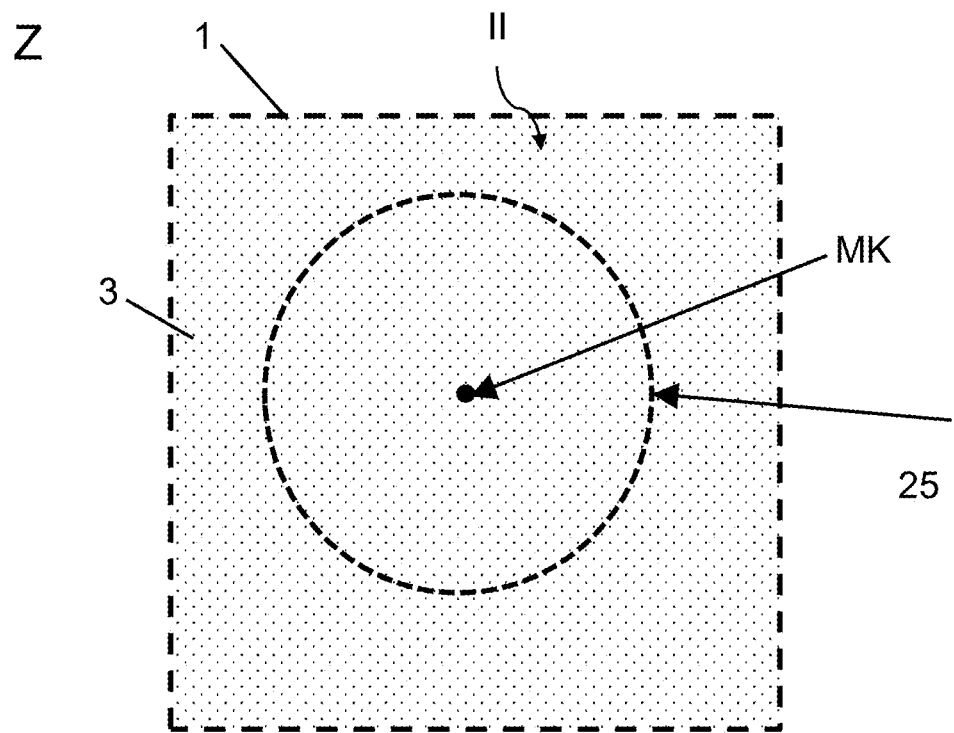
Figure 3B:
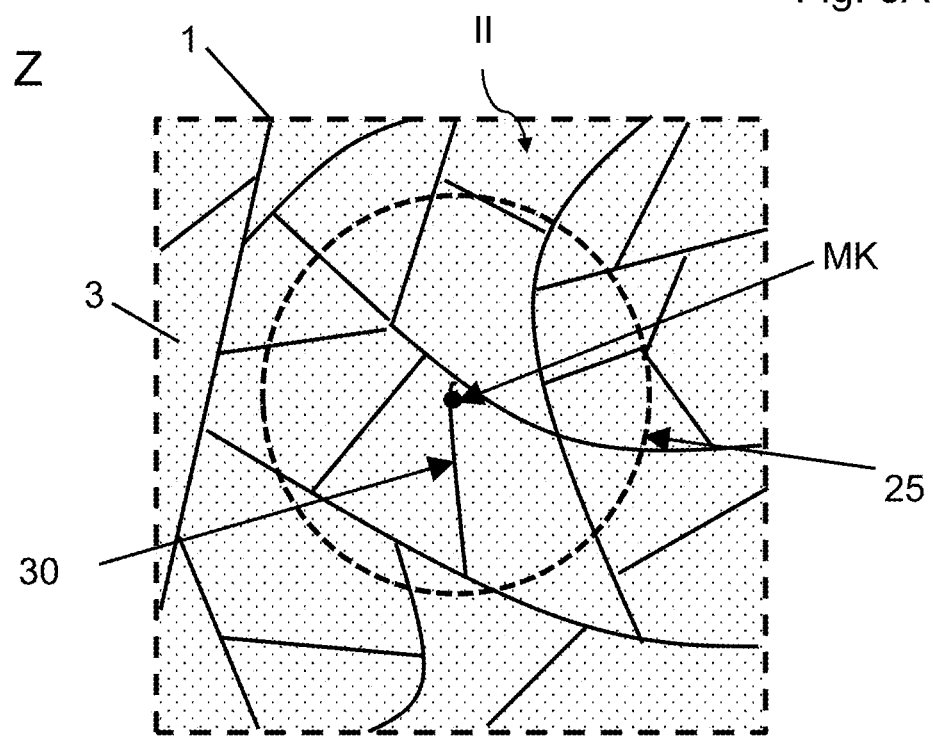
Figure 4A:
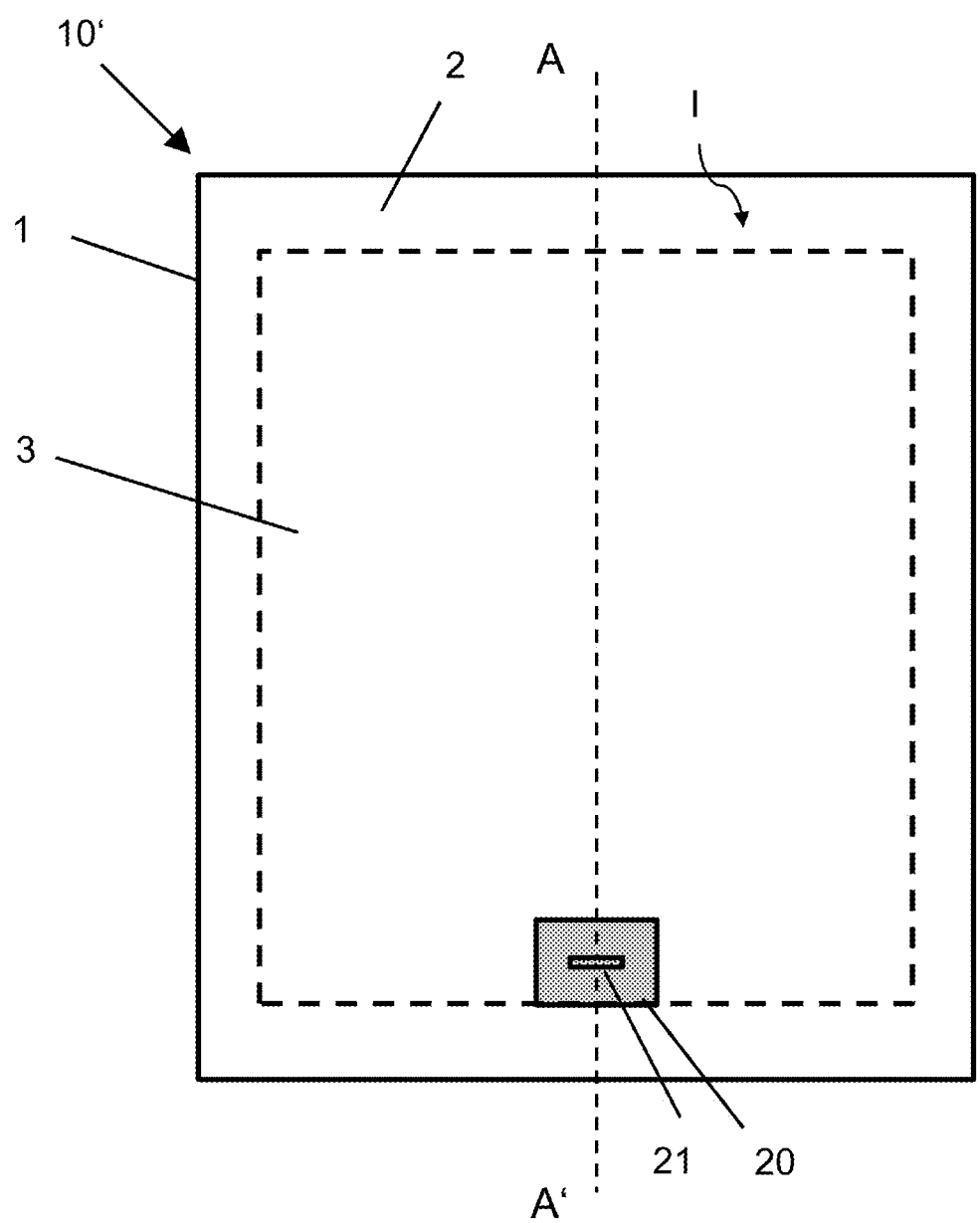
Figure 4B:
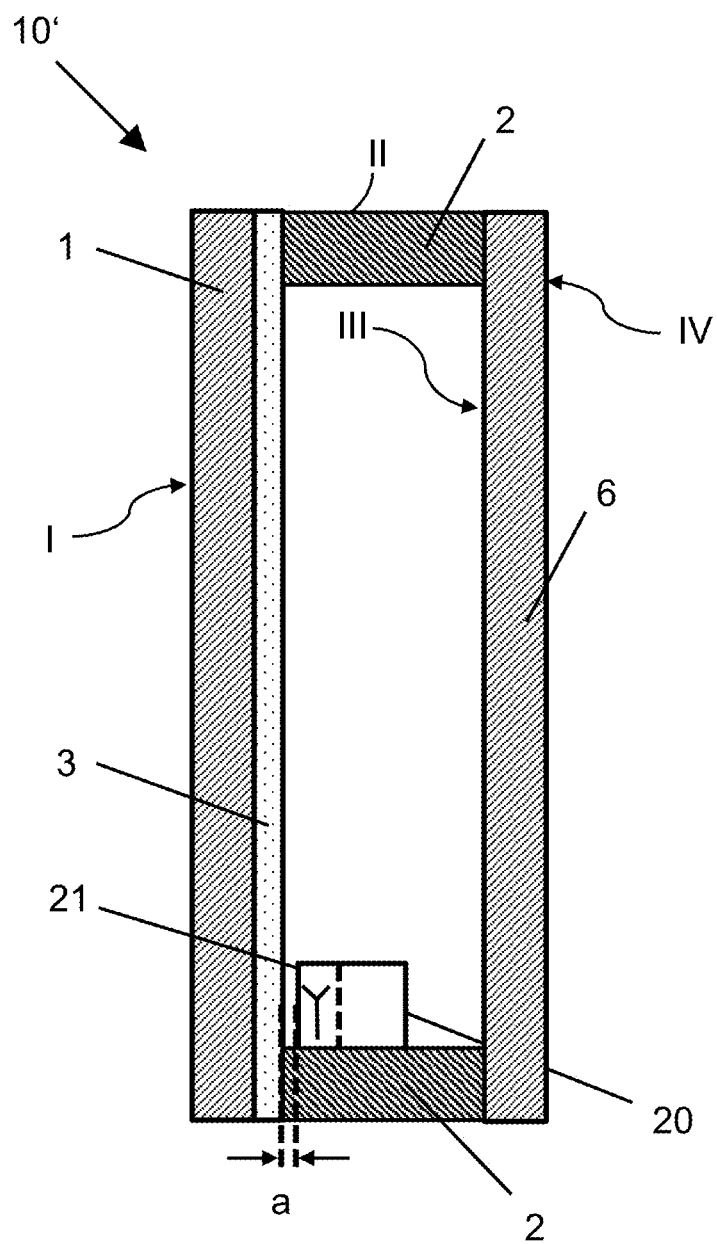

In the following, the invention is explained in detail with reference to drawings and an example. The drawings are not entirely to scale. The invention is in no way restricted by the drawings. They depict:

FIG. 1A a schematic view of an alarm pane assembly according to the invention in plan view;

FIG. 1B a cross-sectional view along the section line A-A' of FIG. 1A;

FIG. 2 a schematic view of a sensor unit according to the invention,

FIG. 3A an enlarged view of the detail Z of the transparent, electrically conductive coating according to the invention with an undamaged first pane;

FIG. 3B an enlarged view of the detail Z of the transparent, electrically conductive coating according to the invention with a broken first pane;

FIG. 4A a schematic view of an alternative alarm pane assembly according to the invention in plan view;

FIG. 4B a cross-sectional view along the section line A-A' of FIG. 4A, and

Figure 5:
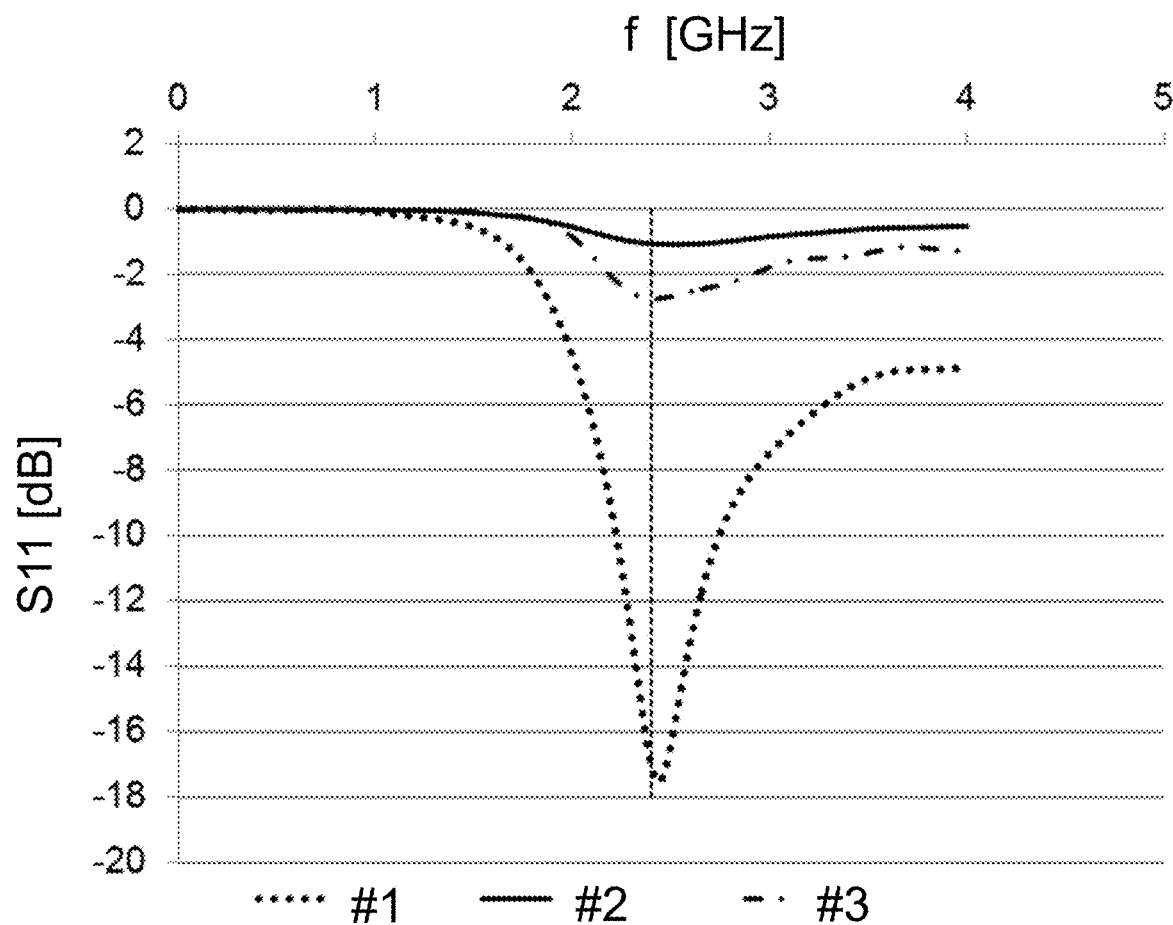

FIG. 5 simulated course of the S11 parameter for an alarm pane assembly 10 according to the invention with two comparative examples.

FIG. 1A depicts a schematic view of an alarm pane assembly 10 according to the invention in plan view of the outer surface I. FIG. 1B depicts a cross-sectional view along the section line A-A' of FIG. 1A.

The alarm pane assembly 10 separates an interior from an exterior environment. The alarm pane assembly 10 is, for example, suitable for protecting valuable items in the interior, for example, in a display case, in a museum, or at a jewelers, against outside access.

The alarm pane assembly 10 comprises a first pane 1 on whose inner surface II a transparent, electrically conductive coating 3 is arranged. In this example, the transparent, electrically conductive coating 3 is arranged on the entire inner surface II of the first pane 1, minus an edge de-coating with a width of, for example, 10 mm from the pane edge of the first pane 1. The edge de-coating serves for corrosion protection against penetrating moisture via the pane edge.

The transparent, electrically conductive coating 3 serves, for example, as an infrared reflecting layer. This means that the share of thermal radiation from entering sunlight is largely reflected. With use of the first pane 1 in an architectural glazing, this provides for reduced heating of the interior by solar irradiation. The transparent, electrically conductive coating 3 is, for example, known from EP 0 847 965 B1 and includes two silver layers which are, in each case, embedded between multiple metal and metal oxide layers. The transparent, electrically conductive coating 3 has a sheet resistance of approx. 4 ohm/square.

The first pane 1 is, for example, a tempered soda lime glass pane with a width of 1 m, a length of 1.5 m, and a thickness of 4 mm. The first pane 1 is tempered, per DIN 12150-1 with a surface compressive stress of, for example, 120 $N/mm^2$. Due to the tempering, the first pane shatters upon damage into blunt-edged fragments with sizes of less than 1 $cm^2$.

In the example depicted, a sensor unit 20 is arranged on the interior side of the first pane 1. Here, the "interior side" means the region that is turned toward the inner surface II, on which the transparent, electrically conductive coating 3 is arranged. The sensor unit 20 has an antenna 21 that is electromagnetically coupled to the transparent, electrically conductive coating 3. Of course, the antenna 21 need not necessarily be incorporated into the same housing as the rest of the sensor unit 20.

The distance a of the antenna 21 from the transparent, electrically conductive coating 3 is, for example, 0.5 mm. The antenna 21 and the transparent, electrically conductive coating 3 are galvanically isolated from one another. An evaluation unit 20.2 in the sensor unit 20 measures the impedance matching of the transmitting unit 20.1 to the antenna 21 of this assembly and compares the measured value with a comparison value. The comparison value is specified with the undamaged first pane 1 with an undamaged transparent, electrically conductive coating 3. The sensor unit 20 determines the deviation, i.e., the difference of the measurement signal of the evaluation unit 20.2 from the comparison value and outputs an alarm signal in the event of deviations that are greater than a defined tolerance. The alarm signal is, for example, a voltage or a voltage pulse with a specific level and/or pulse duration that differs from another neutral output signal, by which means an alarm condition can be identified. Such a deviation typically results upon breakage of the first pane 1 and damage to the transparent, electrically conductive coating 3 associated therewith.

The alarm signal is, for example, forwarded via an alarm transmitting unit (not shown here) to a receiver, to be converted there into an acoustic signal or to send an emergency call.

FIG. 2 depicts a schematic view of the sensor unit 20 according to the invention. The sensor unit 20 has an antenna 21. The antenna 21 is connected via leads to a transmitting unit 20.1 and an evaluation unit 20.2. The distance a is the distance of the antenna 21 from the transparent, electrically conductive coating 3.

The sensor unit 20 has, for example, a plurality of structural stages: the antenna 21 is connected to a transmitting unit 20.1. The transmitting unit 20.1 is connected to a comparator 20.3 via an evaluation unit 20.2. The comparator 20.3 compares the measurement signal with a comparison value and, as appropriate, outputs an alarm signal via the power amplifier 20.4 on the output 22. The voltage standing wave ratio VSWR or the S11 parameter is, for example, measured.

The detection region 25, in which changes in the transparent, electrically conductive coating 3 can be measured particularly precisely, is defined by the design of the antenna 21 and the distance a between the antenna 21 and the transparent, electrically conductive coating 3.

The antenna 21 is, in this example, a dipole antenna and has a length b of 55 mm. Here, for example, the detection region 25 is a circle with a diameter d of 1.1*b, i.e., of approx. 60 mm, wherein the center of the circle MK is defined by orthogonal projection of the center MA of the antenna 21 onto the inner surface (II) of the first pane 1. Of course, the antenna 21 can also be a monopole antenna with an appropriately adapted length b.

FIG. 3A depicts an enlarged view of the detail Z of the transparent, electrically conductive coating 3 according to the invention with an undamaged first pane 1. The transparent, electrically conductive coating 3 is undamaged in particular in the detection region 25 of the antenna 21.

FIG. 3B depicts an enlarged view of the detail Z of the transparent, electrically conductive coating 3 with a broken first pane 1. By means of damage, for example, due to the attempt to penetrate through the first pane 1, this has shattered into small fragments because of its tempering. This results in interruption of the transparent, electrically conductive coating 3 by break lines 30. The fragments are, in each case, smaller than the detection region 25 such that at least one break line 30 is arranged in the detection region 25. By means of the interruption of the transparent, electrically conductive coating 3 by break lines 30, the impedance matching of the antenna 21 changes and an alarm signal can be output.

FIG. 4A depicts a schematic view of an alternative alarm pane assembly 10' according to the invention in plan view; and FIG. 4B, a cross-sectional view along the section line A-A' of FIG. 4A. The alarm pane assembly 10' is, for example, an insulating glass pane that includes the alarm pane assembly 10 of FIGS. 1A and 1B. Additionally, the first pane 1 is bonded to a second pane 6 via a circumferential spacer 2. Here, the sensor unit 20 with the antenna 21 is arranged in the intermediate space that is formed by the first pane 1, the second pane 6, and the spacer 2. The sensor unit 20 is, for example, adhesively bonded onto the lower section of the spacer 2 and thus securely fastened against slippage. The sensor unit 20 includes, for example, an accumulator and a solar cell that charges the accumulator. Furthermore, the sensor unit 20 includes, for example, an alarm transmitting unit that transmits an alarm signal via a Bluetooth connection to a receiver (not shown here) arranged outside the alarm pane assembly 10'. The sensor unit 20 is energy self-sufficient and requires no leads outward—either for the energy supply, or for forwarding an alarm signal. The sensor unit 20 can, for example, be retrofitted in a simple manner into an already existing insulating glass unit.

FIG. 5 depicts the diagram of a simulation of the S11 parameter as a function of the frequency f of the electromagnetic radiation of an antenna 21 according to the invention. The S11 parameter is indicated in decibels (dB). A dashed, vertical guideline is sketched in at the frequency f=2.4 GHz.

The curve #2 depicts the simulated course of the S11 parameter with an alarm pane assembly 10 according to the invention in which the transparent, electrically conductive coating 3 is arranged at a distance a of 4 mm from the antenna 21. The electrical conductivity of the transparent, electrically conductive coating 3 here is, for example, 2 ohm/square. The antenna 21 is optimized to a frequency f of 2.4 GHz. The S11 parameter is −1.1 dB at 2.4 GHz.

As a comparative example, curve #1 depicts the course of the S11 parameter of the assembly 10 of curve #2 without the first pane 1 and, thus, also without the transparent, electrically conductive coating 3. This corresponds to the case in which the first pane 1, has been completely removed during, for example, an intrusion attempt. The S11 parameter is lowered to −17.2 dB at a frequency f of 2.4 GHz.

As another comparative example, curve #3 depicts the course of the S11 parameter of the alarm pane assembly 10 of curve #2, wherein the first pane 1 with the transparent, electrically conductive coating 3 has been replaced by a 1-mm-thick square copper plate with a side length of 60 mm. This corresponds to the case in which—to circumvent the alarm pane assembly 10, for example, during an intrusion attempt—the first pane 1 is replaced by a metal plate. The S11 parameter is, in this case lowered to −2.7 dB at a frequency f of 2.4 GHz.

The simulations show that the impedance matching, simulated here by the S11 parameter is very sensitively dependent on the structure of the alarm pane assembly and tampering with the structure of the alarm pane assembly by altering the impedance matching can be measured with high sensitivity. This was unexpected and surprising for the person skilled in the art.

The invention further includes the following aspects:

An alarm pane assembly (10, 10') according to the invention, wherein the transparent, electrically conductive coating (3) contains at least one metal, preferably silver, nickel, chromium, niobium, tin, titanium, copper, palladium, zinc, gold, cadmium, aluminum, silicon, tungsten, or alloys thereof, and/or at least one metal oxide layer, preferably tin-doped indium oxide (ITO), aluminum-doped zinc oxide (AZO), fluorine-doped tin oxide (FTO, $SnO_2$:F), antimony-doped tin oxide (ATO, $SnO_2$:Sb), and/or carbon nanotubes and/or optically transparent, electrically conductive polymers, preferably poly(3,4-ethylene dioxythiophenes), polystyrene sulfonate, poly(4,4-dioctyl cylopentadithiophene), 2,3-dichloro-5,6-dicyano-1,4-benzoquinone, mixtures, and/or copolymers thereof and/or the transparent, electrically conductive coating (3) has sheet resistance of 0.35 ohm/square to 200 ohm/square, preferably 0.6 ohm/square to 30 ohm/square.

An alarm pane assembly (10,10') according to the invention, wherein the transparent, electrically conductive coating (3) is arranged on at least 50%, preferably at least 70%, particularly preferably 80% to 100%, and in particular 95% to 99% of the area of the inner surface (II) of the first pane.

An alarm pane assembly (10,10') according to the invention, wherein the first pane (1) has flat glass, float glass, quartz glass, borosilicate glass, or soda lime glass and an effective relative permittivity number $\varepsilon_{eff}$ from 6 to 8.

LIST OF REFERENCE CHARACTERS 1 first pane
2 spacer
3 transparent, electrically conductive coating
6 second pane
10,10' alarm pane assembly
20 sensor unit
20.1 transmitting unit
20.2 evaluation unit
20.3 comparator
20.4 power amplifier
21 antenna
22 output
25 detection region
30 break line
A-A' section line
a distance
b length of the antenna 21
d diameter
MA center of the antenna 21
MK circle center
Z detail
I outer surface of the first pane 1
II inner surface of the first pane 1
III outer surface the second pane 6
IV inner surface the second pane 6

The invention claimed is:

1. An alarm pane assembly, comprising:
a first pane that consists of tempered glass, the first pane comprising an outer surface and an inner surface;
a transparent, electrically conductive coating, that is arranged on the inner surface of the first pane;
a sensor unit comprising a transmitting unit and an evaluation unit; and
an antenna that is electromagnetically coupled to the transparent, electrically conductive coating,
wherein the transmitting unit is configured to forward a high-frequency voltage signal with a frequency f in a range of 0.1 GHz to 6 GHz to the antenna,
wherein the antenna is configured to emit an electromagnetic radiation of the frequency f,
wherein the evaluation unit is configured to measure an impedance matching of the transmitting unit to the antenna, and
wherein the sensor unit is configured to output an alarm signal when a measured impedance matching deviates from a reference value.

2. The alarm pane assembly according to claim 1, wherein the transparent, electrically conductive coating is bonded to the first pane so that in an event of breakage of the first pane, the transparent, electrically conductive coating is damaged.

3. The alarm pane assembly according to claim 2, wherein the transparent, electrically conductive coating is deposited directly on the inner surface of the first pane.

4. The alarm pane assembly according to claim 3, wherein the transparent, electrically conductive coating is selected from the group consisting of a cathodic sputtering deposited coating, a chemical vapor deposited coating (CVD), and a thermal evaporation deposited coating.

5. The alarm pane assembly according to claim 2, wherein the transparent, electrically conductive coating is a thin-film stack.

6. The alarm pane assembly according to claim 1, wherein:
the impedance matching is determined by measuring a voltage standing wave ratio VSWR=(V+R)/(V−R),
V is the high frequency voltage signal forwarded by the transmitting unit to the antenna, and
R is a high frequency voltage signal reflected by the antenna to the transmitting unit.

7. The alarm pane assembly according to claim 1, wherein the impedance matching is determined by measuring a scattering parameter S11 of the voltage signal forwarded by the transmitting unit to the antenna.

8. The alarm pane assembly according to claim 7, wherein the sensor unit is configured to output an alarm signal when a measured value of the scattering parameter S11 deviates from the reference value by more than one decibel (1 dB).

9. The alarm pane assembly according to claim 1, wherein a distance between the antenna and the transparent, electrically conductive coating is in a range from 0.1 mm to 20 mm.

10. The alarm pane assembly according to claim 1, wherein the first pane is tempered so that in an event of breakage of the first pane, corresponding first pane fragments are smaller than a detection region of the antenna.

11. The alarm pane assembly according to claim 10, wherein:
the antenna has a length b,
the detection region of the antenna comprises at least one circle with a diameter d that is greater than 0.5*b, and
a center of the circle is defined by an orthogonal projection of a center of the antenna onto the inner surface of the first pane.

12. The alarm pane assembly according to claim 1, wherein the sensor unit further comprises an alarm transmitting unit for wireless communication with an alarm center.

13. The alarm pane assembly according to claim 12, wherein the alarm transmitting unit is a radio alarm transmitting unit that is configured to transmit and/or receive a radio signal via the antenna or via a second antenna.

14. The alarm pane assembly according to claim 1, wherein the sensor unit further comprises an energy supply that is devoid of leads to an external power supply.

15. The alarm pane assembly according to claim 1, further comprising a second pane that is joined via at least one spacer to the first pane.

16. The alarm pane assembly according to claim 15, wherein the spacer completely surrounds an edge of the first pane.

17. The alarm pane assembly according to claim 15, wherein the sensor unit is arranged in an intermediate space between the first pane and the second pane.

18. The alarm pane assembly according to claim 1, wherein the transparent, electrically conductive coating is arranged completely on the inner surface and is devoid of a recess or a coating-free region and/or wherein the first pane has only electrically conductive elements that are transparent.

19. The alarm pane assembly according to claim 18, wherein the first pane exclusively comprises electrically conductive elements that are transparent.

20. A method, comprising:
providing an alarm pane assembly according to claim 1; and
using the alarm pane assembly as one or more of a glazing of a display case or a showcase, an architectural glazing, an insulating glazing, a double insulating glazing, a triple insulating glazing, a fire-resistant glazing, a safety glazing, and a glazing in a vehicle on land, on water, or in the air.

21. A method for operating an alarm pane assembly, the method comprising:
providing an alarm pane assembly including
a first pane that consists of tempered glass, the first pane comprising an outer surface and an inner surface,
a transparent, electrically conductive coating, that is arranged on the inner surface of the first pane,
a sensor unit comprising a transmitting unit and an evaluation unit, and
an antenna that is electromagnetically coupled to the transparent, electrically conductive coating,
wherein the transmitting unit is configured to forward a high-frequency voltage signal with a frequency f in a range of 0.1 GHz to 6 GHz to the antenna,
wherein the antenna is configured to emit an electromagnetic radiation of the frequency f,
wherein the evaluation unit is configured to measure an impedance matching of the transmitting unit to the antenna, and
wherein the sensor unit is configured to output an alarm signal when a measured impedance matching deviates from a reference value;
measuring the impedance matching continuously or periodically; and
based on the measuring, outputting a measured impedance matching as an output signal by the sensor unit.

22. A method for retrofitting a glazing unit, comprising:
providing a glazing unit with a first pane made of tempered glass and with a transparent, electrically conductive coating on an inner surface of the first pane;
retrofitting the glazing unit with a sensor unit with antenna; and
based on the retrofitting, forming an alarm pane assembly that includes
the first pane,
the transparent, electrically conductive coating, that is arranged on the inner surface of the first pane,
the sensor unit comprising a transmitting unit and an evaluation unit, and
the antenna that is electromagnetically coupled to the transparent, electrically conductive coating,
wherein the transmitting unit is configured to forward a high-frequency voltage signal with a frequency f in a range of 0.1 GHz to 6 GHz to the antenna,
wherein the antenna is configured to emit an electromagnetic radiation of the frequency f,
wherein the evaluation unit is configured to measure an impedance matching of the transmitting unit to the antenna, and
wherein the sensor unit is configured to output an alarm signal when a measured impedance matching deviates from a reference value.

\* \* \* \* \*